ELECTRICAL CIRCUIT BOARD WITH COMPONENT STANDOFF

Filed May 16, 1960

INVENTOR
PETER R. SCHULZ
BY Donald F. Voss
ATTORNEY

United States Patent Office 3,089,062

Patented May 7, 1963

3,089,062
ELECTRICAL CIRCUIT BOARD WITH COMPONENT STANDOFF

Peter R. Schulz, Endicott, N.Y., assignor to International Business Machines Corporation, New York, N.Y., a corporation of New York Filed May 16, 1960, Ser. No. 29,460
8 Claims. (Cl. 317—101)

This invention relates to electronic component standoff devices and, more particularly, to electronic component standoff devices formed on the circuit board upon which the components are to be mounted.

It is an established practice to mount electronic components upon boards carrying electrical conductors adherent thereto for interconnecting the components. Generally, the leads of the electronic components extend through apertures provided in the circuit board and are clinched over against the conductors adherent to the circuit board. The electrical connections between the leads of the components and the conductors adherent to the circuit board are completed subsequently by a soldering operation.

In many instances, the electronic component, such as a transistor, lies over the apertures through which its leads project. There are several reasons making it undesirable to permit the electronic component to abut against the circuit board so as to cover the lead receiving apertures. During the soldering operation for establishing the electrical connection between the component leads and the conductors adherent to the circuit board, the columns of air in the lead receiving apertures expand. Hence, a space must be provided beneath the electronic component to permit this air to expand toward the electronic component and not back through the cooling solder joint. If the expanding air was forced through the cooling solder joint, it is quite likely that the same would become defective. Further, prior to the soldering operation, a soldering flux is applied to the surface of the circuit board containing the adherent conductors. During the application of the soldering flux, it passes through the component lead receiving apertures to the other or component supporting side of the circuit board. It is not feasible to remove the soldering flux from the component supporting side of the circuit board prior to the soldering operation. Of course, if the component is abutting against the surface of the circuit board, the soldering flux underneath the component is trapped and will not be removed in a subsequent cleaning operation. Solder flux is generally corrosive and otherwise deleterious to the electronic components. If the electronic component is spaced from the circuit board, the soldering flux can be removed after the soldering operation. An additional factor to consider is that electronic components, during their operation, generate heat and, unless this heat is dissipated, the components may become permanently damaged. Hence, it is preferable to provide a space between the component and circuit board to enable cooling air to circulate around all sides of the component.

Heretofore it has been the practice to provide the electronic components with short legs or protuberances so as to space the base of the component from the circuit board. While this is a satisfactory way of spacing the electronic components from the circuit board, it is rather expensive and difficult to provide such spacing legs for miniature electronic components. Further, many manufacturers of electronic components do not provide such legs. This requires the user of electronic components acquired from many different sources to provide some other means for achieving the desired spacing for those components without spacing legs.

In one instance, a dielectric disc having holes for receiving the component leads and equally spaced projecting feet on each side of the disc was provided. While this disc arrangement satisfactorily spaces the electronic component from the circuit board, the dielectric discs were found to be expensive and were difficult to assemble onto the electronic component. Additionally, the use of the dielectric discs required that the components be inserted against gravity.

In the present invention, component standoff pads or projections for supporting the components are formed on the circuit board itself. The component standoff pads are formed from the circuit board material by applying a heated forming stylus under pressure to the circuit board. As it will be seen later herein, the geometry of the component standoff pad is quite important. The component standoff pads satisfy the soldering, defluxing and cooling requirements of a component standoff. Since the component standoff is formed directly from the circuit board, no additional material costs are involved.

Accordingly, it is a prime object of the invention to provide an improved electronic component standoff support.

Another very important object of the invention is to provide an electronic component standoff support which is upon the circuit board for mounting the electronic components.

Still another very important object of the invention is to provide an electronic component standoff support which is formed from the circuit board material of the circuit board for mounting the electronic components.

An additional object of the invention is to provide an electronic component standoff support which is relatively inexpensive.

Yet another object of the invention is to provide an electronic component standoff support which does not impose additional requirements upon apparatus for mounting the components.

The foregoing and other objects, features and advantages of the invention will be apparent from the following more particular description of a preferred embodiment of the invention, as illustrated in the accompanying drawings.

Figure 1:
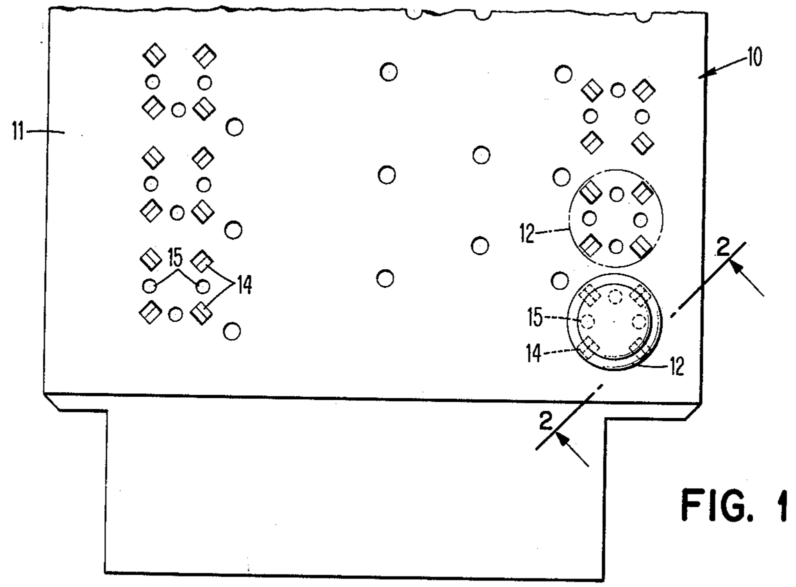
FIG. 1 is a plan view showing a circuit board with component standoff pads formed therefrom adjacent component lead receiving apertures and with a component mounted thereon.

With reference to the drawings and particularly to FIG. 1, the invention is illustrated by way of example as a circuit board 10 having one face or side 11 for supporting electronic components 12 and an opposite face 13 for carrying electrical conductors, not shown. In FIG. 1, the circuit board 10 is actually shown in enlarged form so as to bring out the details of component standoff pads 14 formed from the circuit board 10 adjacent to and intermediate of component lead receiving apertures 15. The number of component standoff pads 14 associated with any one component can vary. The number of component standoff pads 14 and component lead receiving apertures may exceed the number actually required for a component so that the same may be oriented with its leads in any one of several positions. By this arrangement, the interconnecting circuitry may be simplified.

Figure 2:
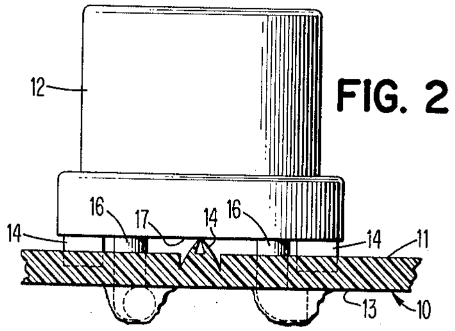
FIG. 2 is a sectional view taken along the line 2—2 in FIG. 1 looking in the direction of the arrows.

The component standoff pads 14 must maintain the components in spaced relationship relative to the board 10, as seen in FIG. 2. A load is placed upon the component standoff pads 14 as the electronic components 12 are inserted into position relative to the circuit board 10. Normally, the leads 16 extend from the base 17 of the components 12 to project through the receiving apertures 15. The leads 16 extend through the apertures 15 sufficiently so as to permit the base of the electronic components to abut against the standoff pads 14. The component leads 16 are clinched against the face 13 carrying the electrical conductors, not shown, and are subsequently joined thereto by a soldering operation. As the component leads are clinched against the face 13, the base 17 of the component 12 bears against the associated component standoff pad 14 with a relatively high degree of pressure. Hence, the standoff pads 14 must have sufficient structural strength to withstand this high degree of pressure without collapsing.

Figure 3:
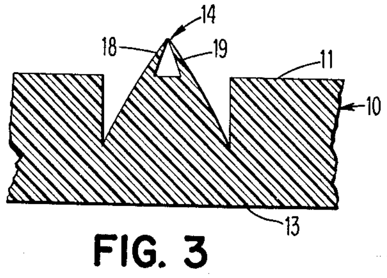
FIG. 3 is an enlarged sectional view of a component standoff pad formed from a circuit board; and, FIG. 4 is an isometric view of the forming stylus for forming the component standoff pads from a circuit board.

In this example, the component standoff pads 14 each consist of a pair of formed projections 18 and 19 projecting out of the plane of the circuit board 10 and inclined toward each other in abutting relationship so as to form an arch as seen in FIGS. 2 and 3. As the load is placed upon the formed projections 18 and 19, by the base 17 of the component 12, the projections 18 and 19 will abut each other under pressure, but will not collapse. Further, the projecting members 18 and 19 will not have a tendency to shear from the base of the circuit board 10. The projections 18 and 19 are not very strong in tension because, in the forming process, they become embrittled. However, by forming the projections so that they abut each other, they are maintained under a compressive load. The angle at which the projections 18 and 19 extend can vary to some extent; a 60° angle has been found to be very satisfactory. The material comprising the circuit board 10 has some influence upon the geometry of the standoff pads 14.

Figure 4:
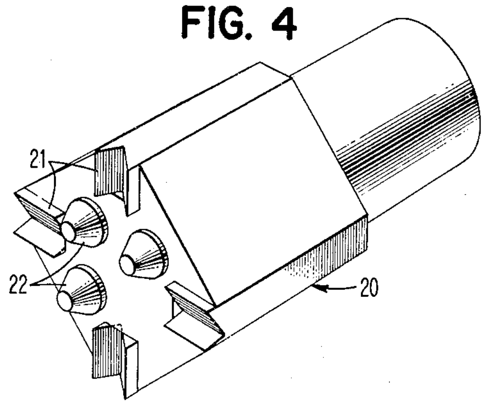

The component standoff pads 14 are formed from the circuit board 10 by means of a forming stylus 20, as shown in FIG. 4. The forming stylus 20 is adapted to be heated and applied under pressure to the circuit board 10. In addition to the elements 21 fixed to project from the face of the forming stylus 20, the stylus is provided with projections 22 for tapering the component lead receiving apertures 15 to facilitate insertion of the component leads 16.

From the above, it is seen that the invention provides component standoff pads which will support electrical components, making line contact therewith, in spaced relationship relative to a circuit board. The component standoff pads are arranged to support the electrical components so that the base thereof is parallel to the circuit board. The component standoff pads are disposed to accommodate different types or configurations of components oriented in any one of several angular positions.

Because the component standoff mounting pads are formed from the circuit board, they do not involve additional material costs. The component standoff pads are arranged to support the components near the periphery thereof so as to achieve a high degree of stability.

While the invention has been particularly shown and described with reference to a preferred embodiment thereof, it will be understood by those skilled in the art that various changes in form and details may be made therein without departing from the spirit and scope of the invention.

What is claimed is:

1. A support for electronic components comprising a dielectric planar member; and a series of dielectric component standoff pads each projecting in the same direction out of the plane of said planar member for supporting components in spaced relationship relative to said planar member, said standoff pads consisting of a pair of projecting members inclined toward each other in abutting relationship.

2. The support for electronic components of claim 1 wherein said projecting members are formed from said planar member.

3. Apparatus comprising a dielectric planar member having a series of component lead receiving apertures formed therein; a series of dielectric component standoff pads disposed adjacent said component lead receiving apertures to project in the same direction out of the plane of said planar member; and an electronic component having a base and a series of leads projecting from said base, said electronic component being positioned so that said leads project into said apertures to permit said base to be supported by said standoff pads in spaced relationship relative to said planar member.

4. The apparatus of claim 3 wherein said standoff pads are disposed to permit a fluid medium to freely circulate beneath said base and around said leads.

5. The apparatus of claim 4 wherein each of said standoff pads is formed to establish a line of contact with said base.

6. The apparatus of claim 5 wherein said standoff pads comprise a pair of projections inclined toward each other to form an arch.

7. The apparatus of claim 6 wherein said pair of projections are formed from said planar member.

8. A support for electronic components having a base with leads projecting from said base, comprising a dielectric planar member having component lead receiving apertures formed therein, and component standoff pads disposed adjacent said component lead receiving apertures, each standoff pad projecting in the same direction out of the plane of said planar member for supporting said components in spaced relationship relative to said planar member.

References Cited in the file of this patent

UNITED STATES PATENTS

| | | |
|---|---|---|
| 2,802,995 | Mautone | Aug. 13, 1957 |
| 2,869,040 | Pifer | Jan. 13, 1959 |